United States Patent
Sakatsume et al.

(10) Patent No.: US 10,381,160 B2
(45) Date of Patent: Aug. 13, 2019

(54) MULTI-LAYER CERAMIC ELECTRONIC COMPONENT

(71) Applicant: Taiyo Yuden Co., Ltd., Tokyo (JP)

(72) Inventors: Katsuo Sakatsume, Tokyo (JP); Masumi Ishii, Tokyo (JP); Takeshi Nosaki, Toyko (JP); Norihiro Arai, Tokyo (JP); Jyouji Ariga, Tokyo (JP); Yasushi Inoue, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/677,330

(22) Filed: Aug. 15, 2017

(65) Prior Publication Data
US 2018/0053601 A1 Feb. 22, 2018

(30) Foreign Application Priority Data

Aug. 17, 2016 (JP) .................................. 2016-160087

(51) Int. Cl.
*H01G 4/30* (2006.01)
*H01G 4/232* (2006.01)
(Continued)

(52) U.S. Cl.
CPC .............. *H01G 4/30* (2013.01); *H01G 4/232* (2013.01); *H01G 4/248* (2013.01);
(Continued)

(58) Field of Classification Search
CPC ............................. H01G 4/228; H01G 4/232
See application file for complete search history.

(56) References Cited

U.S. PATENT DOCUMENTS

| | | | |
|---|---|---|---|
| 9,245,687 B2* | 1/2016 | Kim | H01G 4/005 |
| 2007/0165361 A1* | 7/2007 | Randall | H01G 4/232 |
| | | | 361/306.3 |

(Continued)

FOREIGN PATENT DOCUMENTS

JP 2015-037178 A 2/2015

*Primary Examiner* — Eric W Thomas
(74) *Attorney, Agent, or Firm* — Saliwanchik, Lloyd & Eisenschenk (57) ABSTRACT

A multi-layer ceramic electronic component includes a multi-layer unit and an external electrode. The multi-layer unit includes an end surface oriented in a first direction, a side surface oriented in a second direction orthogonal to the first direction, a ridge connecting the end surface and the side surface, ceramic layers, and internal electrodes. The multi-layer ceramic electronic component satisfies the following relationships: $A/L \geq 0.0142*\ln(L)+0.0256$, $A/T \geq 0.0274*\ln(T)+0.0719$, $B/L \geq 0.0103*\ln(L)+0.0281$, and $B/T \geq 0.0189*\ln(T)+0.0707$, where A represents a thickness of the external electrode in the second direction at a position adjacent to the ridge on the side surface, B represents a thickness of the external electrode in the first direction at a position adjacent to the ridge on the end surface, L represents a dimension of the multi-layer ceramic electronic component in the first direction, and T represents a dimension of the multi-layer ceramic electronic component in the second direction.

4 Claims, 7 Drawing Sheets

(51) Int. Cl.
*H01G 4/248* (2006.01)
*H01L 41/047* (2006.01)
H01F 27/28 (2006.01)
H01L 41/083 (2006.01)

(52) U.S. Cl.
CPC ...... *H01L 41/0472* (2013.01); *H01F 27/2804* (2013.01); *H01F 2027/2809* (2013.01); *H01L 41/0471* (2013.01); *H01L 41/083* (2013.01)

(56) References Cited

U.S. PATENT DOCUMENTS

| | | | |
|---|---|---|---|
| 2012/0138350 A1* | 6/2012 | Chae | H05K 13/021 |
| | | | 174/260 |
| 2014/0085770 A1* | 3/2014 | Park | H01G 4/30 |
| | | | 361/305 |
| 2015/0016016 A1* | 1/2015 | Lee | H01G 4/385 |
| | | | 361/301.4 |
| 2015/0043124 A1 | 2/2015 | Kim et al. | |
| 2015/0068792 A1* | 3/2015 | Cho | H01G 4/12 |
| | | | 174/258 |
| 2017/0018362 A1* | 1/2017 | Nishisaka | H01G 4/30 |

* cited by examiner

FIG.10

MULTI-LAYER CERAMIC ELECTRONIC COMPONENT

CROSS REFERENCE TO RELATED APPLICATION

This application claims priority and benefit of Japanese Patent Application No. 2016-160087, filed Aug. 17, 2016, the entire contents of which are incorporated herein by reference.

BACKGROUND

The present invention relates to a multi-layer ceramic electronic component capable of being miniaturized.

Along with miniaturization of electronic devices, recently, there have increasingly been demands for miniaturization of multi-layer ceramic capacitors used in the electronic devices. For example, Japanese Patent Application Laid-open No. 2015-037178 discloses a multi-layer ceramic capacitor capable of being mounted to a miniaturized electronic device.

SUMMARY

Recently, along with further miniaturization of electronic devices, further miniaturized multi-layer ceramic capacitors used in such electronic devices are anticipated. In order to further miniaturize the multi-layer ceramic capacitors, it is necessary to reduce the thickness of an external electrode in addition to reduction in size of a body.

In order to reduce the thickness of an external electrode, it is effective to thinly form an electrical conductive paste on both end surfaces of the body before sintering in the manufacturing process. When the electrical conductive paste is made thin, however, gaps are easily generated in a base film derived from the electrical conductive paste after sintering. When such gaps are generated, a plating solution, moisture, or the like easily infiltrates from those gaps, and reliability of the multi-layer ceramic capacitor may be reduced.

In view of the circumstances as described above, it is desirable to provide a multi-layer ceramic electronic component with ensured reliability even if the thickness of an external electrode is made small along with miniaturization.

According to an embodiment of the present invention, there is provided a multi-layer ceramic electronic component including a multi-layer unit and an external electrode.

The multi-layer unit includes an end surface oriented in a first direction, a side surface oriented in a second direction orthogonal to the first direction, a ridge connecting the end surface and the side surface, laminated ceramic layers, and internal electrodes disposed between the ceramic layers and drawn to the end surface.

The external electrode covers the multi-layer unit from the side of the end surface.

The multi-layer ceramic electronic component satisfies the following relationships:

$A/L \geq 0.0142*\ln(L)+0.0256$, $A/T \geq 0.0274*\ln(T)+0.0719$, $B/L \geq 0.0103*\ln(L)+0.0281$, and $B/T \geq 0.0189*\ln(T)+0.0707$, where A represents a thickness of the external electrode in the second direction at a position adjacent to the ridge on the side surface, B represents a thickness of the external electrode in the first direction at a position adjacent to the ridge on the end surface, L represents a dimension of the multi-layer ceramic electronic component in the first direction, and T represents a dimension of the multi-layer ceramic electronic component in the second direction.

In this configuration, even if the thickness of the external electrode is made small along with miniaturization of the multi-layer ceramic electronic component, a sufficient thickness is ensured for the external electrode that covers the ridge of the multi-layer unit. This can prevent a plating solution or moisture from infiltrating into the multi-layer unit and suppress reduction in reliability.

The dimension L may be 0.3 mm or less.

The dimension T may be 0.2 mm or less.

It is possible to provide a multi-layer ceramic electronic component with ensured reliability even if the thickness of an external electrode is made small along with miniaturization.

These and other objects, features and advantages of the present invention will become more apparent in light of the following detailed description of embodiments thereof, as illustrated in the accompanying drawings.

DETAILED DESCRIPTION OF EMBODIMENTS

Hereinafter, an embodiment of the present invention will be described with reference to the drawings.

In the figures, an X axis, a Y axis, and a Z axis orthogonal to one another are shown as appropriate. The X axis, the Y axis, and the Z axis are common in all figures.

1. Configuration of Multi-Layer Ceramic Capacitor 10

Figure 1:
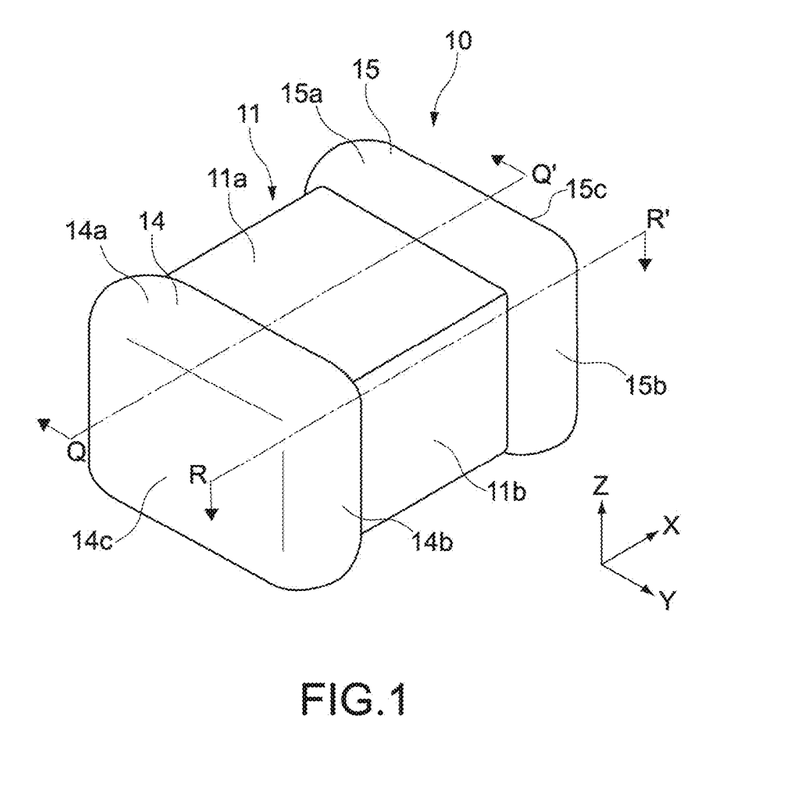
FIG. 1 is a perspective view of a multi-layer ceramic capacitor according to one embodiment of the present invention.
Figure 2:
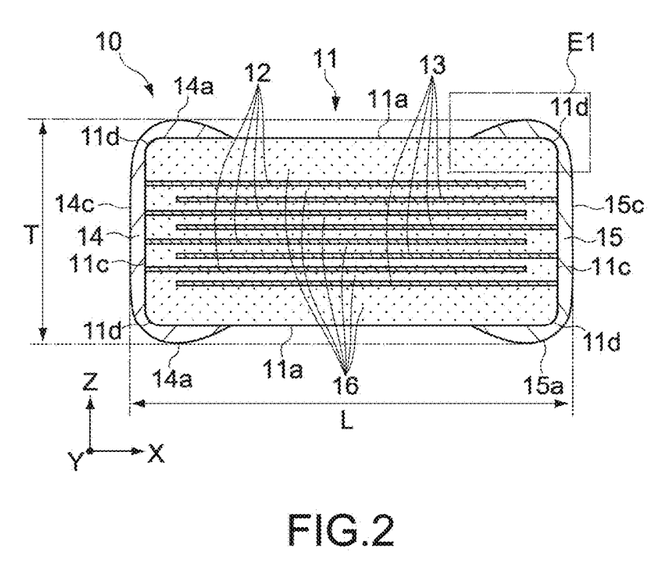
FIG. 2 is a cross-sectional view of the multi-layer ceramic capacitor taken along the Q-Q' line in FIG. 1.

FIG. 1 is a perspective view of a multi-layer ceramic capacitor 10 according to one embodiment of the present invention. FIG. 2 is a cross-sectional view of the multi-layer ceramic capacitor 10 taken along the Q-Q' line in FIG. 1.

Figure 3:
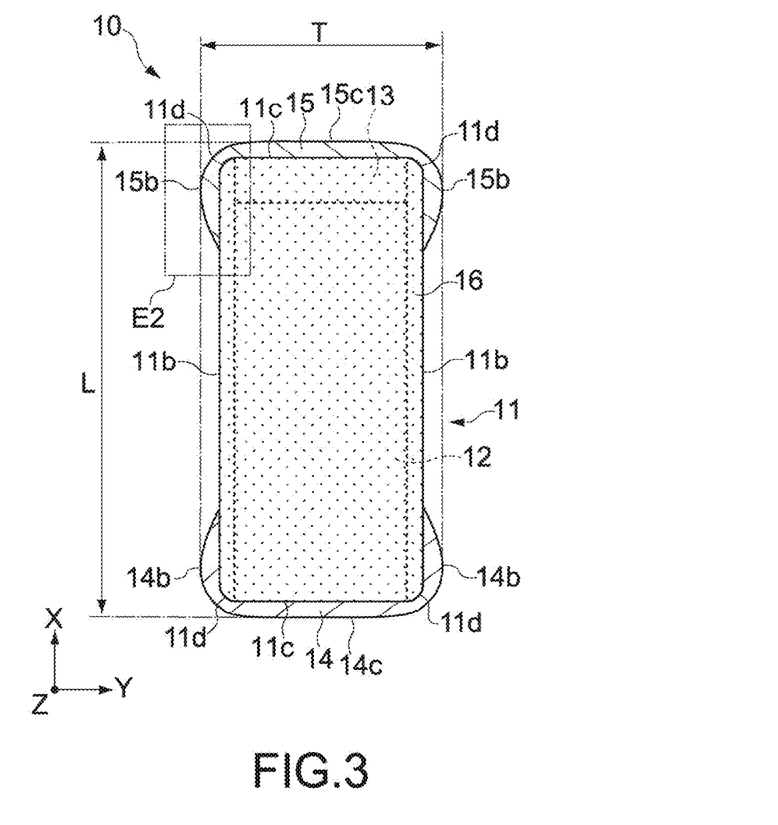
FIG. 3 is a cross-sectional view of the multi-layer ceramic capacitor taken along the R-R' line in FIG. 1.

FIG. 3 is a cross-sectional view of the multi-layer ceramic capacitor 10 taken along the R-R' line in FIG. 1.

The multi-layer ceramic capacitor 10 includes a body 11, a first external electrode 14, and a second external electrode 15. The first external electrode 14 and the second external electrode 15 are provided to respective end surfaces 11c (both end surfaces in an X-axis direction) of the body 11.

Typically, the body 11 has two side surfaces 11a oriented in a Z-axis direction and two side surfaces 11b oriented in a Y-axis direction. Ridges 11d connecting the side surfaces 11a and 11b and the end surfaces 11c of the body 11 are chamfered. It should be noted that the form of the body 11 is not limited to the form as described above. For example, the side surfaces 11a and 11b and the end surfaces 11c of the body 11 may be curved surfaces, and the body 11 may be rounded as a whole.

The body 11 includes a plurality of first internal electrodes 12, a plurality of second internal electrodes 13, and a plurality of ceramic layers 16. The first internal electrodes 12 and the second internal electrodes 13 are paired with each other and alternately laminated between the ceramic layers 16.

The first internal electrodes 12 are connected to the first external electrode 14, and the second internal electrodes 13 are connected to the second external electrode 15. With this configuration, when a voltage is applied to the first external electrode 14 and the second external electrode 15 in the multi-layer ceramic capacitor 10, a voltage is applied to the ceramic layers 16 between the first internal electrodes 12 and the second internal electrodes 13. Thus, the multi-layer ceramic capacitor 10 stores charge corresponding to the voltage applied between the first external electrode 14 and the second external electrode 15.

The first internal electrodes 12 and the second internal electrodes 13 are each made of an electrical conductive material and function as internal electrodes of the multi-layer ceramic capacitor 10. Examples of the electrical conductive material include nickel (Ni), copper (Cu), palladium (Pd), platinum (Pt), silver (Ag), gold (Au), and a metal material including an alloy of them.

The ceramic layers 16 are made of ceramics. In the body 11, in order to increase capacitances of the respective ceramic layers provided between the first internal electrodes 12 and the second internal electrodes 13, a material having a high dielectric constant is used as a material forming the ceramic layers 16. For the material of the ceramic layers 16, polycrystal of a barium titanate ($BaTiO_3$) based material, i.e., polycrystal having a Perovskite structure containing barium (Ba) and titanium (Ti) can be used, for example.

Alternatively, the material of the ceramic layers 16 may contain polycrystal of a strontium titanate ($SrTiO_3$) based material, a calcium titanate ($CaTiO_3$) based material, a magnesium titanate ($MgTiO_3$) based material, a calcium zirconate ($CaZrO_3$) based material, a calcium zirconate titanate ($Ca(Zr,Ti)O_3$) based material, a barium zirconate ($BaZrO_3$) based material, a titanium oxide ($TiO_2$) based material, or the like. It should be noted that the ceramic layers 16 may contain a rare earth element, silicon (Si) or an oxide thereof, or the like.

The first external electrode 14 and the second external electrode 15 cover the body 11 from the end surfaces 11c side and extend from the end surfaces 11c to the side surfaces 11a and 11b. With this configuration, both of the first external electrode 14 and the second external electrode 15 have U-shaped cross sections in parallel with an X-Z plane and an X-Y plane.

Further, the first external electrode 14 and the second external electrode 15 according to this embodiment each have a non-constant thickness in the X-axis direction, the Y-axis direction, and the Z-axis direction. The first external electrode 14 and the second external electrode 15 each have the smallest thickness at positions covering the ridges 11d (see FIGS. 4 and 5 to be described later).

However, also at the positions covering the ridges 11d, a sufficient thickness of the first external electrode 14 and the second external electrode 15 is ensured. Thus, the following is less likely to occur: discontinuous portions (holes or the like) are formed in the first external electrode 14 and the second external electrode 15 at the ridges 11d of the body 11, and thus the body 11 is exposed. Therefore, in the multi-layer ceramic capacitor 10, moisture or the like is prevented from infiltrating between the body 11 and the first external electrode 14 or the second external electrode 15, and thus reliability is ensured.

The multi-layer ceramic capacitor 10 according to this embodiment only needs to include the body 11, the first external electrode 14, and the second external electrode 15, and other configurations can be changed as appropriate. For example, the number of first internal electrodes 12 and second internal electrodes 13 can be determined as appropriate in accordance with the size and performance expected for the multi-layer ceramic capacitor 10.

Further, in FIG. 2, in order to make the facing state of the first and second internal electrodes 12 and 13 easily viewable, the number of first internal electrodes 12 and the number of second internal electrodes 13 are each set to four. However, actually, more first and second internal electrodes 12 and 13 are provided so as to ensure the capacitance of the multi-layer ceramic capacitor 10.

Figure 4:
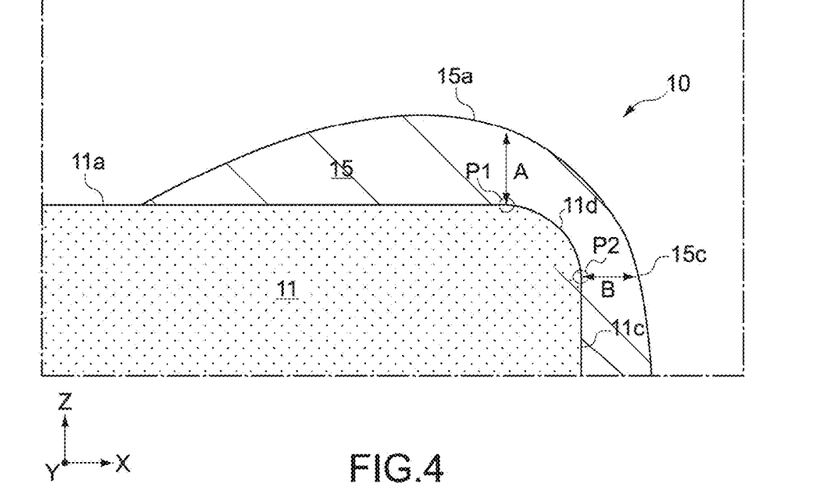
FIG. 4 is an enlarged schematic diagram of an area E1 of the multi-layer ceramic capacitor shown in FIG. 2.
Figure 5:
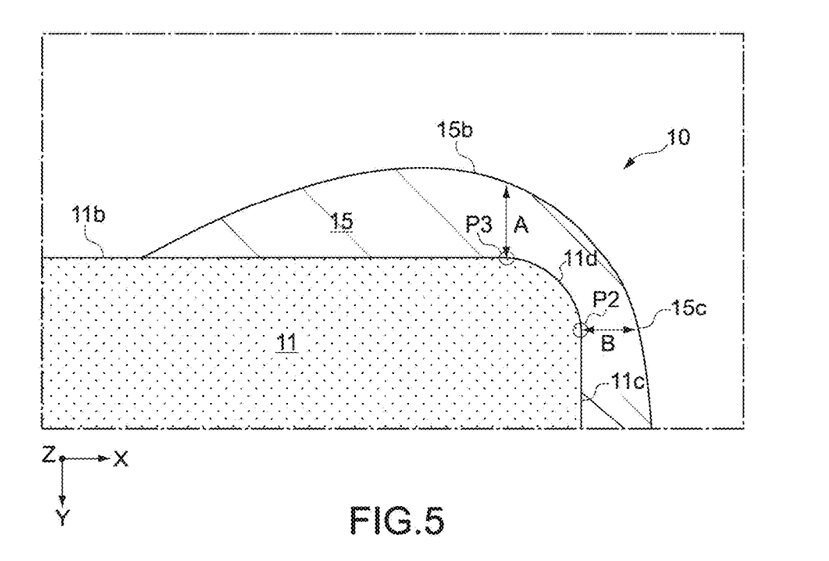
FIG. 5 is an enlarged schematic diagram of an area E2 of the multi-layer ceramic capacitor shown in FIG. 3.

FIG. 4 is an enlarged schematic diagram of an area E1 shown in FIG. 2. FIG. 5 is an enlarged schematic diagram of an area E2 shown in FIG. 3. FIGS. 4 and 5 are enlarged diagrams of the ridge 11d of the body 11. FIGS. 2 to 5 show dimensions of the multi-layer ceramic capacitor 10. It should be noted that FIGS. 4 and 5 show only the second external electrode 15, but the first external electrode 14 also has a configuration similar to that of the second external electrode 15. Thus, the following description is given while showing not only the reference symbols of the second external electrode 15 but also those of the first external electrode 14.

Specifically, A represents the thickness of each of the first external electrode 14 and the second external electrode 15 in the Z-axis direction and the Y-axis direction at positions adjacent to the ridges 11d of the body 11 on the side surfaces 11a and 11b.

In other words, in a cross section parallel with the X-Z plane of the multi-layer ceramic capacitor 10 shown in FIG. 4, the thickness A is defined as a distance in the Z-axis direction from a connection point P1, which is between the side surface 11a and the ridge 11d, to each of side surfaces 14a and 15a of the first and second external electrodes 14 and 15, the side surfaces 14a and 15a being oriented in the Z-axis direction.

Further, in a cross section parallel with the X-Y plane of the multi-layer ceramic capacitor 10 shown in FIG. 5, the thickness A is defined as a distance in the Y-axis direction from a connection point P3, which is between the side surface 11b and the ridge 11d, to each of side surfaces 14b and 15b of the first and second external electrodes 14 and 15, the side surfaces 14b and 15b being oriented in the Y-axis direction.

Furthermore, B represents the thickness of each of the first external electrode 14 and the second external electrode 15 in the X-axis direction at positions adjacent to the ridges 11*d* of the body 11 on the end surfaces 11*c*.

In other words, the thickness B is defined as a distance in the X-axis direction from a connection point P2, which is between the end surface 11*c* and the ridge 11*d*, to each of end surfaces 14*c* and 15*c* of the first and second external electrodes 14 and 15, the end surfaces 14*c* and 15*c* being oriented in the X-axis direction.

Moreover, T represents a dimension of the multi-layer ceramic capacitor 10 in each of the Z- and Y-axis directions, which includes the first external electrode 14 and the second external electrode 15.

In other words, in the cross section parallel with the X-Z plane of the multi-layer ceramic capacitor 10 shown in FIG. 4, the dimension T is a dimension of the multi-layer ceramic capacitor 10 in the Z-axis direction.

Further, in the cross section parallel with the X-Y plane of the multi-layer ceramic capacitor 10 shown in FIG. 5, the dimension T is a dimension of the multi-layer ceramic capacitor 10 in the Y-axis direction.

Additionally, L represents a dimension of the multi-layer ceramic capacitor 10 in the X-axis direction (longitudinal direction), which includes the first external electrode 14 and the second external electrode 15.

The configuration of this embodiment is effective particularly in the case where the dimension L is 0.3 mm or less and the dimension T is 0.2 mm or less. However, the dimensions L and T are not limited to those described above and may be approximately several hundreds µm. Further, the thickness A and the thickness B can also be approximately several µm.

2. Evaluation of Reliability of Multi-Layer Ceramic Capacitor 10

FIGS. 6 to 9 are graphs each showing a relationship between the thickness A or B of the first and second external electrodes 14 and 15 and the dimension L or T of the multi-layer ceramic capacitor 10. The inventors of the subject application performed a hygroscopicity test where many multi-layer ceramic capacitors 10 were held at temperature 85° C. and humidity 85% under application of a voltage of 10 V. For each of the multi-layer ceramic capacitors 10 after subjected to the hygroscopicity test, an electric resistance value was measured, and samples whose electric resistance value was less than 10 MΩ were determined as failure, thus evaluating reliability of the multi-layer ceramic capacitors 10.

Next, for each of the multi-layer ceramic capacitors 10 not determined as failure and the multi-layer ceramic capacitors 10 determined as failure, the thickness A and the dimension L were measured and A/L (the ratio of the thickness A to the dimension L) was calculated. The dimension L and the A/L, of each of the multi-layer ceramic capacitors 10 not determined as failure and the multi-layer ceramic capacitors 10 determined as failure were plotted in a graph of FIG. 6 showing the dimension L on the horizontal axis and the A/L on the vertical axis.

Figure 6:
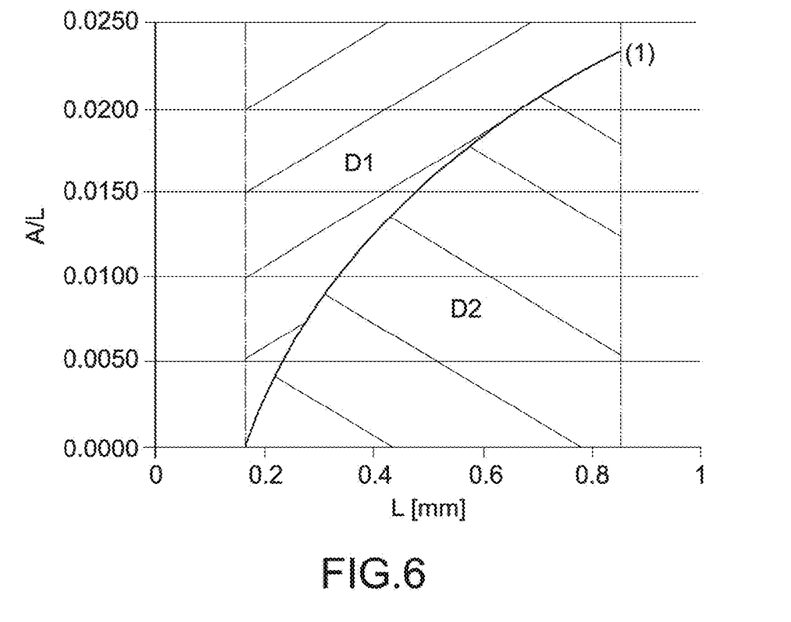
FIG. 6 is a graph showing a relationship between a thickness A of an external electrode and a dimension L according to the multi-layer ceramic capacitor.

As a result, it was observed that points corresponding to the multi-layer ceramic capacitors 10 not determined as failure fall in a range D1 shown in FIG. 6, and points corresponding to the multi-layer ceramic capacitors 10 determined as failure fall in a range D2 shown in FIG. 6.

On the basis of those results, the inventors of the subject application calculated a border indicating whether the reliability of the multi-layer ceramic capacitor 10 is ensured, i.e., a boundary between the range D1 and the range D2, in the relationship between the dimension L and the A/L of the multi-layer ceramic capacitor 10. The border is expressed by the following Expression (1).

$$A/L = 0.0142 * \ln(L) + 0.0256 \quad (1)$$

In this embodiment, since the points corresponding to the multi-layer ceramic capacitors 10 not determined as failure fall in the range D1 as described above, it is desirable that the A/L satisfy the following Expression (2).

$$A/L \geq 0.0142 * \ln(L) + 0.0256 \quad (2)$$

Figure 7:
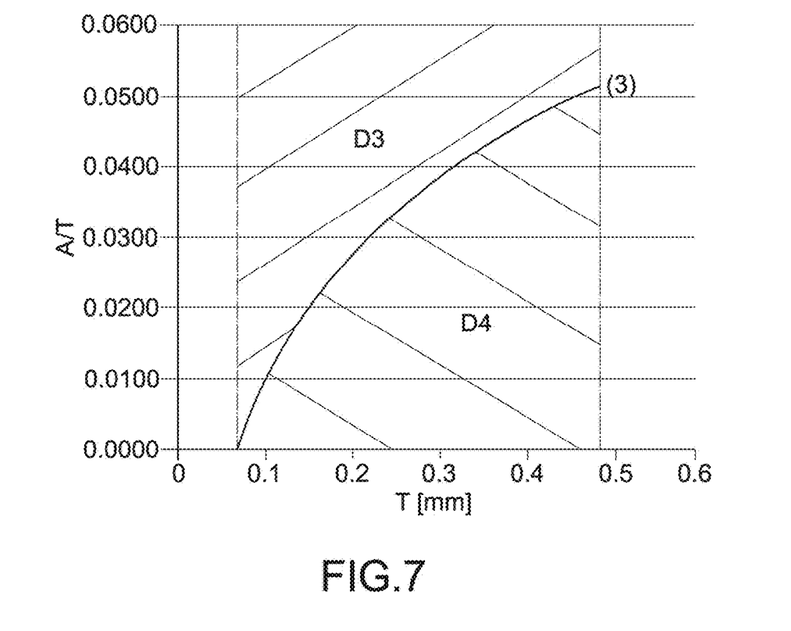
FIG. 7 is a graph showing a relationship between the thickness A of the external electrode and a dimension T according to the multi-layer ceramic capacitor.
Figure 8:
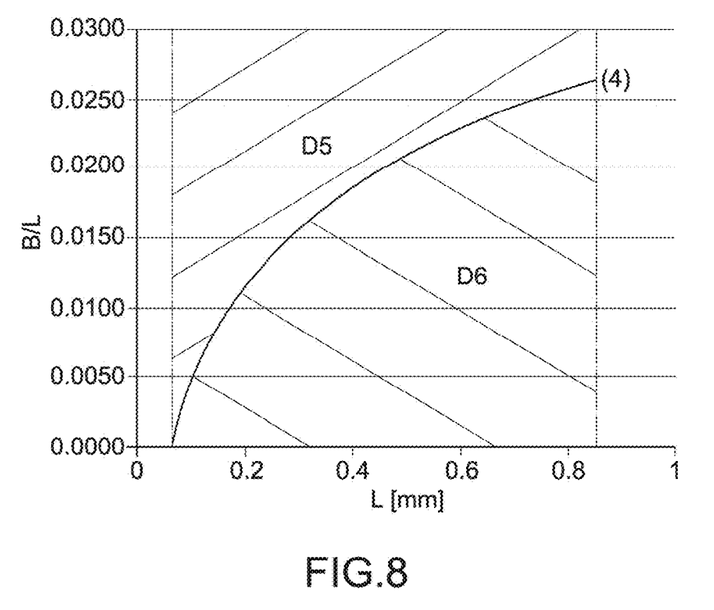
FIG. 8 is a graph showing a relationship between a thickness B of the external electrode and the dimension L according to the multi-layer ceramic capacitor.
Figure 9:
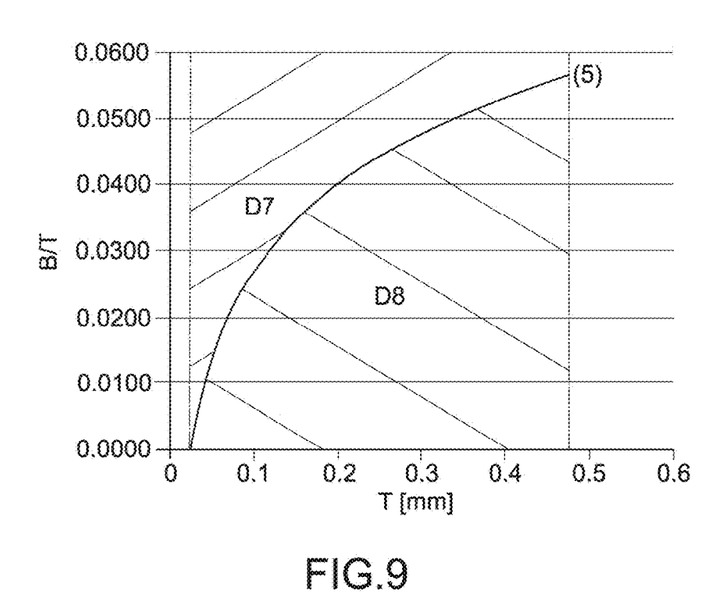
FIG. 9 is a graph showing a relationship between the thickness B of the external electrode and the dimension T according to the multi-layer ceramic capacitor.

Subsequently, using a method similar to the method of calculating the Expression (1), the inventors of the subject application calculated borders indicating whether the reliability of the multi-layer ceramic capacitor 10 is ensured in the relationships between the dimension T and the A/T (the ratio of the thickness A to the dimension T), between the dimension L and the B/L (the ratio of the thickness B to the dimension L), and between the dimension T and the B/T (the ratio of the thickness B to the dimension T). The borders are expressed by the following Expressions (3) to (5).

$$A/T = 0.0274 * \ln(T) + 0.0719 \quad (3)$$

$$B/L = 0.0103 * \ln(L) + 0.0281 \quad (4)$$

$$B/T = 0.0189 * \ln(T) + 0.0707 \quad (5)$$

In this embodiment, it was observed that points corresponding to the multi-layer ceramic capacitors 10 not determined as failure fall in ranges D3, D5, and D7 shown in FIGS. 7, 8, and 9, respectively, and points corresponding to the multi-layer ceramic capacitors 10 determined as failure fall in ranges D4 D6, and D8 shown in FIGS. 7, 8, and 9, respectively. Thus, it is desirable that the A/T, the B/L, and the B/T satisfy the following Expressions (6) to (8), respectively.

$$A/T \geq 0.0274 * \ln(T) + 0.0719 \quad (6)$$

$$B/L \geq 0.0103 * \ln(L) + 0.0281 \quad (7)$$

$$B/T \geq 0.0189 * \ln(T) + 0.0707 \quad (8)$$

When the A/L, the A/T, the B/L, and the B/T satisfy the Expression (2), the Expression (6), the Expression (7), and the Expression (8), respectively, in the multi-layer ceramic capacitor 10, even if the thickness of the first external electrode 14 and the second external electrode 15 is made small along with miniaturization, a sufficient thickness is ensured in the first external electrode 14 and the second external electrode 15 at positions covering the ridges 11*d* of the body 11. This makes it difficult for moisture or the like to infiltrate into the body 11, and reduction in reliability is thus suppressed.

As described above, it is experimentally observed that reliability is ensured for the multi-layer ceramic capacitors 10 plotted in the ranges D1, D3, D5, and D7 shown in FIGS. 6 to 9.

3. Method of Manufacturing Multi-Layer Ceramic Capacitor 10

Figure 10:
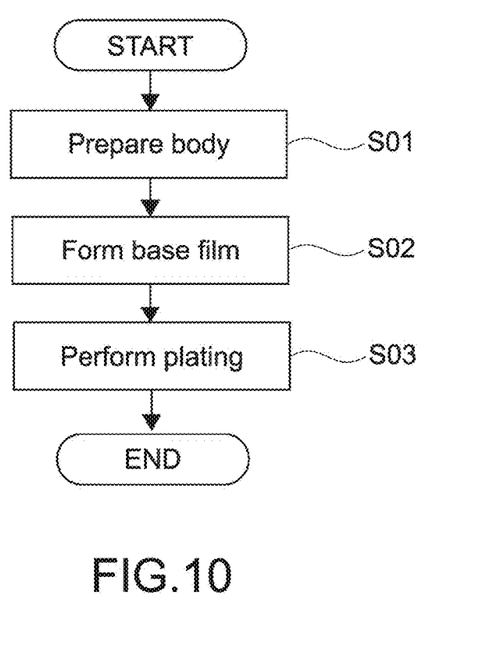
FIG. 10 is a flowchart showing a method of manufacturing the multi-layer ceramic capacitor.

FIG. 10 is a flowchart showing a method of manufacturing the multi-layer ceramic capacitor 10. Hereinafter, a method of manufacturing the multi-layer ceramic capacitor 10 will be described along FIG. 10.

3.1 Step S01: Preparation of Body

First, ceramic sheets for forming the body 11 are prepared. The ceramic sheets are configured as unsintered dielectric green sheets and formed into sheets by using a roll coater or a doctor blade, for example.

Next, an electrical conductive paste is printed on the ceramic sheets by means of a screen printing method or a gravure printing method, for example. Thus, unsintered internal electrodes being the first internal electrodes 12 and the second internal electrodes 13 of the multi-layer ceramic capacitor 10 are formed.

Subsequently, the ceramic sheets with the unsintered internal electrodes are laminated, and a multi-layer sheet is thus obtained. Next, the multi-layer sheet is cut with a rotary blade, a push-cutting blade, or the like, to produce an unsintered body 11.

Next, the unsintered body 11 is sintered to produce the body 11 of the multi-layer ceramic capacitor 10.

A sintering temperature for the body 11 can be determined on the basis of a sintering temperature for ceramics. For example, when a barium titanate ($BaTiO_3$) based material is used as the ceramics, the sintering temperature for the body 11 can be set to approximately 1,000 to 1,300° C. Further, sintering can be performed in a reduction atmosphere or a low-oxygen partial pressure atmosphere, for example.

3.2 Step S02: Formation of Base Film

In Step S02, base films of the first external electrode 14 and the second external electrode 15 are formed on both the end surfaces 11c of the body 11 obtained in Step S01. Specifically, first, an unsintered electrode material is applied so as to cover both the end surfaces 11c of the body 11.

Subsequently, the body 11 is sintered in a reduction atmosphere or a low-oxygen partial pressure atmosphere, for example, to form base films on the body 11.

In this embodiment, in the case where the electrode material is applied to the body 11 by a dip method, the body 11 is immersed in the electrode material, and after the immersion, a speed at which the body 11 is separated from the electrode material (blotting speed) is adjusted, so that the thickness of the base film is adjusted so as to be a sufficient thickness.

Specifically, the thickness of the base film is adjusted such that the A/L, the A/T, the B/L, and the B/T of the multi-layer ceramic capacitor 10 satisfy the Expression (2), the Expression (6), the Expression (7), and the Expression (8), respectively. Thus, even if the thickness of the first external electrode 14 and the second external electrode 15 is made small along with miniaturization, gaps are prevented from being formed in the base film after sintering.

It should be noted that Step S02 may be performed after the unsintered body 11 is produced. Specifically, an unsintered electrode material is applied to both the end surfaces of the unsintered body 11. At the same time as the sintering of the unsintered body 11, the unsintered electrode material is subjected to baking, to form base films of the first external electrode 14 and the second external electrode 15.

3.3 Step S03: Plating

In Step S03, intermediate films and surface films of the first external electrode 14 and the second external electrode 15 are formed on the base films baked onto the body 11 by plating such as electrolytic plating. Thus, the first external electrode 14 and the second external electrode 15 are formed.

In Step S03, since gaps are prevented from being formed in the base film in Step S02 described above, a plating solution is prevented from infiltrating from those gaps. Therefore, reduction in reliability of the multi-layer ceramic capacitor 10 subjected to the plating is thus suppressed.

4. Examples

Hereinafter, Examples of the present invention will be described.

4.1 Manufacturing of Multi-Layer Ceramic Capacitor 10

400 samples of the multi-layer ceramic capacitor 10 were produced for each of Examples 1 to 3 and Comparative Examples 1 and 2 by the manufacturing method described above. In the method of manufacturing the samples according to Examples 1 to 3 and Comparative Examples 1 and 2, a blotting speed in the step of forming a base film differs between the examples, and the other conditions are common.

Example 1

Samples according to Example 1 were produced such that the dimension L is approximately 0.2 mm and the dimension T is approximately 0.1 mm.

Example 2

In samples according to Example 2, the blotting speed was slowed down relative to Example 1 by 5%.

Example 3

In samples according to Example 3, the blotting speed was slowed down relative to Example 1 by 10%.

Comparative Example 1

In samples according to Comparative Example 1, the blotting speed was speeded up relative to Example 1 by 10%.

Comparative Example 2

In samples according to Comparative Example 2, the blotting speed was speeded up relative to Example 1 by 5%.

In the samples according to Examples 1 to 3 and Comparative Examples 1 and 2, since the blotting speed differs therebetween, the thickness A and B of the first external electrode 14 and the second external electrode 15 (see FIGS. 4 and 5) differ, and thus the dimensions L and T of the samples (see FIGS. 2 and 3) also differ. Table 1 shows the thickness A and B of the first external electrode 14 and the second external electrode 15 and the dimensions L and T of the samples, for the samples according to Examples 1 to 3 and Comparative Examples 1 and 2. In Table 1, the thickness A, the thickness B, the dimension L, and the dimension T are each shown as an average value of all the samples of each of Examples 1 to 3 and Comparative Examples 1 and 2.

TABLE 1

| Sample | A [mm] | B [mm] | L [mm] | T [mm] |
| --- | --- | --- | --- | --- |
| Comparative Example 1 | 0.0008 | 0.0028 | 0.2320 | 0.1070 |
| Comparative Example 2 | 0.0010 | 0.0030 | 0.2320 | 0.1070 |
| Example 1 | 0.0014 | 0.0032 | 0.2324 | 0.1078 |
| Example 2 | 0.0018 | 0.0034 | 0.2328 | 0.1086 |
| Example 3 | 0.0022 | 0.0036 | 0.2332 | 0.1094 |

4.2 Evaluation of Multi-Layer Ceramic Capacitor 10

Hygroscopicity was evaluated for the samples of the multi-layer ceramic capacitor 10 according to Examples 1 to 3 and Comparative Examples 1 and 2.

Specifically, a hygroscopicity test was performed, in which 400 samples of each of Examples 1 to 3 and Comparative Examples 1 and 2 were held at temperature 85° C. and humidity 85% under application of a voltage of 10 V. For each of the samples after subjected to the hygroscopicity test, an electric resistance value was measured, and samples whose electric resistance value was less than 10 MΩ were determined as failure. Table 2 shows the right-hand side (RHS) and the left-hand side (LHS) of each of the Expression (1), the Expression (3), the Expression (4), and the Expression (5), and the number of failures for the samples of each example.

TABLE 2

| Sample | A/L (LHS of Ex. (1)) | 0.0142 × ln(L) + 0.0256 (RHS of Ex. (1)) | A/T (LHS of Ex. (3)) | 0.0274 × ln(T) + 0.0719 (RHS of Ex. (3)) | B/L (LHS of Ex. (4)) | 0.0103 × ln(L) + 0.0281 (RHS of Ex. (4)) | B/T (LHS of Ex. (5)) | 0.0189 × ln(L) + 0.0707 (RHS of Ex. (5)) | Number of failures [out of 400 pcs] |
| --- | --- | --- | --- | --- | --- | --- | --- | --- | --- |
| Comparative Example 1 | 0.0034 | 0.0049 | 0.0075 | 0.0107 | 0.0121 | 0.0131 | 0.0262 | 0.0285 | 10 |
| Comparative Example 2 | 0.0043 | 0.0049 | 0.0093 | 0.0107 | 0.0129 | 0.0131 | 0.0280 | 0.0285 | 3 |
| Example 1 | 0.0060 | 0.0049 | 0.0130 | 0.0109 | 0.0138 | 0.0131 | 0.0297 | 0.0286 | 0 |
| Example 2 | 0.0077 | 0.0049 | 0.0166 | 0.0111 | 0.0145 | 0.0131 | 0.0313 | 0.0287 | 0 |
| Example 3 | 0.0094 | 0.0049 | 0.0201 | 0.0113 | 0.0154 | 0.0131 | 0.0329 | 0.0289 | 0 |

Referring to Table 2, faulty samples were observed in the samples according to Comparative Examples 1 and 2. In the samples according to Comparative Examples 1 and 2, a value based on the left-hand side of each of the Expression (1), the Expression (3), the Expression (4), and the Expression (5) is smaller than that based on the right-hand side of each of the Expression (1), the Expression (3), the Expression (4), and the Expression (5).

Meanwhile, faulty samples were not observed in the samples according to Examples 1 to 3. In the samples according to Examples 1 to 3, a value based on the left-hand side of each of the Expression (1), the Expression (3), the Expression (4), and the Expression (5) is larger than that based on the right-hand side of each of the Expression (1), the Expression (3), the Expression (4), and the Expression (5).

On the basis of those results, it was experimentally observed that, when the A/L, the A/T, the B/L, and the B/T of the multi-layer ceramic capacitor 10 satisfy the Expression (2), the Expression (6), the Expression (7), and the Expression (8), respectively, optimal moisture resistance is obtained.

5. Other Embodiments

While the embodiment of the present invention has been described, the present invention is not limited to the embodiment described above, and it should be appreciated that the present invention may be variously modified.

For example, in the embodiment described above, the multi-layer ceramic capacitor has been described as an example of a multi-layer ceramic electronic component, but the present invention can be applied to any other multi-layer ceramic electronic components in which internal electrodes are alternatively disposed to form pairs. Examples of such multi-layer ceramic electronic components include a multi-layer inductor and a piezoelectric element.

What is claimed is:

1. A multi-layer ceramic electronic component, comprising:
    a multi-layer unit that includes
        an end surface oriented in a first direction,
        a side surface oriented in a second direction orthogonal to the first direction,
        a ridge connecting the end surface and the side surface,
        laminated ceramic layers, and
        internal electrodes disposed between the ceramic layers along a third direction perpendicular to the first and second directions and drawn to the end surface; and
    an external electrode that covers the multi-layer unit from the end surface to the side surface, the multi-layer ceramic electronic component satisfying the following relationships:

$0.0094 \geq A/L \geq 0.0142*\ln(L)+0.0256$, $0.0201 \geq A/T \geq 0.0274*\ln(T)+0.0719$, $0.0154 \geq B/L \geq 0.0103*\ln(L)+0.0281$, and $0.0329 \geq B/T \geq 0.0189*\ln(T)+0.0707$, where A represents a thickness of the external electrode in the second direction measured from a connection point that is between the side surface and the ridge on the side surface, B represents a thickness of the external electrode in the first direction measured from a connection point that is between the end surface and the ridge on the end surface, L represents a dimension of the multi-layer ceramic electronic component in the first direction, the dimension L is 0.3 mm or less, T represents a dimension of the multi-layer ceramic electronic component in the second direction, the dimension T is 0.2 mm or less, the value of L used in ln(L) in the relationships is the numerical portion of L in millimeters, and the value of T used in ln(T) in the relationships is the numerical portion of T in millimeters.

2. The multi-layer ceramic electronic component according to claim 1, wherein the internal electrodes comprise nickel (Ni), copper (CU), palladium (Pd), platinum (Pt), silver (Ag), gold (Au), or any alloy thereof.

3. The multi-layer ceramic electronic component according to claim 1, wherein the ceramic layers contain at least one metal oxide selected from barium titanate ($BaTiO_3$), strontium titanate ($SrTiO_3$), calcium titanate ($Ca\ TiO_3$), magnesium titanate ($Mg\ TiO_3$), calcium zirconate ($CaZrO_3$), calcium zirconate titanate ($Ca(Zr,Ti)O_3$), barium zirconate ($BaZrO_3$), and titanium oxide ($TiO_2$).

4. The multi-layer ceramic electronic component according to claim 1, wherein 1.4 µm≤A≤2.2 µm, and wherein 3.2 µm≤B≤3.6 µm.

* * * * *